United States Patent [19]

Shima et al.

[11] Patent Number: 5,792,314
[45] Date of Patent: Aug. 11, 1998

[54] METHOD OF REMOVING PHOTOSENSITIVE RESIN AND PHOTOSENSITIVE RESIN REMOVING APPARATUS

[75] Inventors: Hiroyuki Shima; Tadashi Nishioka, both of Hyogo, Japan

[73] Assignees: Ryoden Semiconductor System Engineering Corporation, Itami; Mitsubishi Denki Kabushiki Kaisha, Tokyo, both of Japan

[21] Appl. No.: 429,770

[22] Filed: Apr. 27, 1995

[30] Foreign Application Priority Data

Dec. 27, 1994  [JP]  Japan .................. 6-340056

[51] Int. Cl.$^6$ ........................ H01L 21/302
[52] U.S. Cl. .................. 156/643.1; 156/646.1
[58] Field of Search ............ 156/643.1, 646.1; 134/1.1, 1.2, 1.3

[56] References Cited

U.S. PATENT DOCUMENTS

| | | | |
|---|---|---|---|
| 4,673,456 | 6/1987 | Spencer et al. | 156/345 |
| 4,938,839 | 7/1990 | Fujimura et al. | 156/643.1 X |
| 4,946,549 | 8/1990 | Bachman et al. | 156/345 |
| 4,961,820 | 10/1990 | Shinagawa et al. | 156/643.1 |
| 4,983,254 | 1/1991 | Fujimura et al. | 156/643.1 |
| 5,057,187 | 10/1991 | Shinagawa et al. | |
| 5,198,634 | 3/1993 | Mattson et al. | 216/48 X |
| 5,201,994 | 4/1993 | Nonaka et al. | 156/345 |
| 5,226,056 | 7/1993 | Kikuchi et al. | 156/345 X |
| 5,382,316 | 1/1995 | Hills et al. | 216/48 X |
| 5,397,432 | 3/1995 | Konno et al. | 156/643.1 |

FOREIGN PATENT DOCUMENTS 0 345 757  12/1989  European Pat. Off. .

OTHER PUBLICATIONS

Resist and Sidewall Film Remoral after Al Reactive Ion Etching (RIE) Employing F+H$_2$O Downstream Ashing. Jpn. Phys. vol. 32 (1993) pp. 3045–3050 Part 1, No. 6B, Jun. 1993.

*Primary Examiner*—Thi Dang
*Attorney, Agent, or Firm*—Oblon, Spivak, McClelland, Maier & Neustadt, P.C.

[57] ABSTRACT

A photosensitive resin removing method is capable of completely removing a photosensitive resin employed as a photoresist in an etching process for etching an aluminum film, and its derivatives and of improving the durability of a photosensitive resin removing apparatus for carrying out the method. A mixed gas is produced by mixing fluorine compound gas and steam, the mixed gas is excited with microwaves, and the photosensitive resin is exposed to the excited mixed gas to gasify the photosensitive resin.

10 Claims, 6 Drawing Sheets

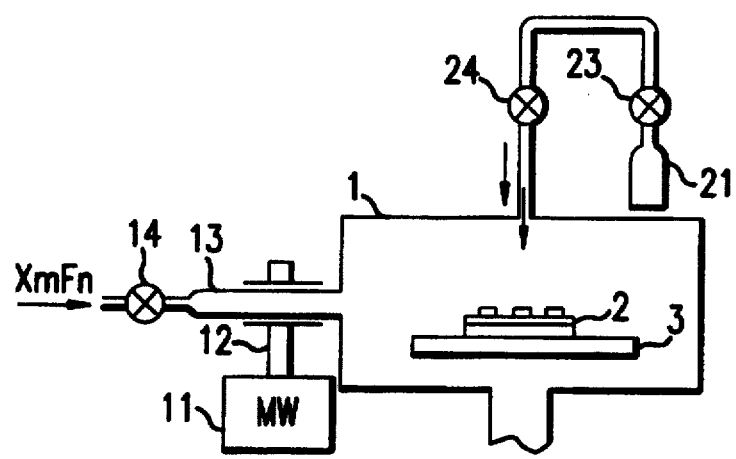
FIG. 6
(PRIOR ART)
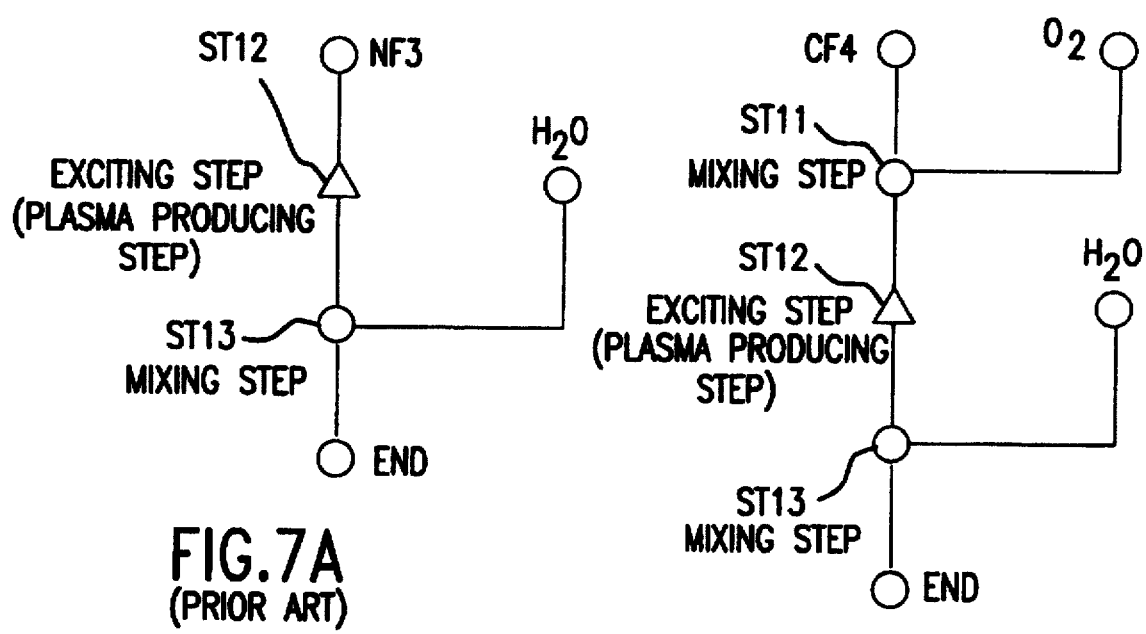
FIG. 7A
(PRIOR ART)
FIG. 7B
(PRIOR ART)

METHOD OF REMOVING PHOTOSENSITIVE RESIN AND PHOTOSENSITIVE RESIN REMOVING APPARATUS

BACKGROUND OF THE INVENTION

1. Field of the Invention

The present invention relates to a method of removing a photosensitive resin employed in fabricating a semiconductor integrated circuit, and a photoresist resin removing apparatus suitable for carrying out the method and, more particularly, to a method of removing a photosensitive resin after etching an aluminum and a photosensitive resin removing apparatus for carrying out the method.

2. Description of the Prior Art

When forming an aluminum (Al) pattern by photolithography and dry etching, such as reactive ion etching (RIE), a photosensitive resin employed as a photoresist must be removed after an etching process. In some cases, derivatives of the photosensitive resin are produced in the photosensitive resin during the etching process. Methods of removing the photosensitive resin and the derivatives are mentioned in the following documents.

1) Proc. 10th Symp. Dry Process, Tokyo; pp. 124–128 (1988) (First document)

2) Jpn. J. Appl. Phys., Vol. 32, Pt. 1, No. 6B, pp. 3045–3050 (1993) (Second document)

FIG. 6 shows the configuration of a photosensitive resin removing apparatus mentioned in the first document. Referring to FIG. 6, there are shown a removing reaction chamber 1 in which an reaction for removing photosensitive resins is carried out, a stage 3 contained in the removing reaction chamber 1, a workpiece 2 as an object which is mounted on the stage 3 and from which photosensitive resins is removed, an electromagnetic-wave generator 11 that generates microwaves, a waveguide 12 for transmitting the microwaves generated by the electromagnetic-wave generator 11, a quartz tube 13 extended through the waveguide 12 and opening into the removing reaction chamber 1, a valve 14 for regulating the flow rate of a fluorine compound gas ($X_mF_n$) supplied through the quartz tube 13 into the removing reaction chamber 1, a water tank 21 containing water ($H_2O$), a valve 23 for regulating the flow rate of steam, and a valve 24 which is opened to supply steam into the removing reaction chamber 1.

The operation of the photosensitive resin removing apparatus will be described with reference to process diagrams shown in FIGS. 7(A) and 7(B). Positive photoresists widely used in recent years are novolac resins (naphthoquinone-azide resins). Therefore, the operation will be described on an assumption that the photosensitive resin is a novolac resin. FIG. 7(A) is a process diagram of a photosensitive resin removing process using nitrogen trifluoride gas ($NF_3$ gas) as the $X_mF_n$ gas, and FIG. 7(B) is a process diagram of a photosensitive resin removing process using a mixed gas consisting of carbon tetrafluoride gas ($CF_4$ gas) and oxygen gas ($O_2$ gas). When the mixed gas is used, $CF_4$ gas and $O_2$ gas are mixed in step ST11.

The $NF_3$ gas or mixed gas is supplied through the valve 14 into the quartz tube 13 in which microwaves prevail. Then, the $NF_3$ gas or the mixed gas is excited by the microwaves in the quartz tube 13 in step ST12.

The excited $NF_3$ gas or the excited mixed gas is supplied into the removing reaction chamber. Meanwhile, steam ($H_2O$) generated by heating the water contained in the water tank 21 is supplied through the valves 23 and 24 into the removing reaction chamber 1 and, consequently, the $NF_3$ gas or the mixed gas and the steam are mixed in the removing reaction chamber 1 in step ST13. Fluorine atoms (F) dissociated from the $X_mF_n$ gas interact with $H_2O$ to produce oxygen atoms (O). Then oxygen atoms acts chemically on the components of the photo-sensitive resin to gasify the photosensitive resin. Reaction products produced by the interaction between the components of the photosensitive resin and oxygen atoms are discharged from the removing reaction chamber 1. Thus, the mixed gas acts on the layer of the photosensitive resin formed on the surface of the workpiece 2 to remove the photosensitive resin by a process generally known as an ashing process.

Since the prior art photosensitive resin removing method is thus carried out, $H_2O$ mixed to the $X_mF_n$ gas is not excited. Therefore, most fluorine atoms dissociated from $X_mF_n$ gas are used for decomposing $H_2O$; that is, since fluorine atoms do not play roll in removing the photosensitive resin, the photosensitive resin removing ability of the photosensitive resin removing apparatus is not very high and the residual photosensitive resin cannot completely be removed.

Furthermore, the quartz glass ($SiO_2$) forming the quartz tube 13 is eroded by the fluorine atoms and fluorine molecules dissociated from the fluorine compound while the $NF_3$ gas or the mixed gas flows through the quartz tube 13 and pores are formed in the wall of the quartz tube 13 in a comparatively short period of operating time and the $NF_3$ gas or the mixed gas leaks from the quartz tube 13. Thus, the photosensitive resin removing apparatus that carries out the prior art photosensitive resin removing method has low durability.

SUMMARY OF THE INVENTION

The present invention has been made to solve the problems in the prior art and it is therefore an object of the present invention to provide a photosensitive resin removing method capable of completely removing the residual photosensitive resin and the residual derivatives remaining on a workpiece after etching an aluminum layer formed on the workpiece and of improving the durability of the associated photosensitive resin removing apparatus, and to provide a photosensitive resin removing apparatus for carrying out the photosensitive resin removing method.

A photosensitive resin removing method in a first aspect of the present invention comprises a mixing step of mixing a fluorine compound gas and steam to produce a mixed gas, an exciting step of exciting the mixed gas, and a reaction step of exposing a photosensitive resin to the mixed gas to gasify the photosensitive resin. In the exciting step, both the fluorine compound gas and steam are excited, and both fluorine atoms dissociated from the fluorine compound gas and oxygen atoms dissociated from steam contribute to removing the photosensitive resin and the derivatives.

A photosensitive resin removing method in a second aspect of the present invention uses nitrogen trifluoride as the fluorine compound. In the exciting step, steam is excited as well as nitrogen trifluoride. Both fluorine atoms dissociated form nitrogen fluoride gas and oxygen atoms dissociated from steam contribute to removing the photosensitive resin and the derivatives.

A photosensitive resin removing method in a third aspect of the present invention uses carbon tetrafluoride as the fluorine compound. In the exciting step, steam is excited as well as carbon tetrafluoride. Both fluorine atoms dissociated from carbon tetrafluoride gas and oxygen atoms dissociated from steam contribute to removing the photosensitive resin and the derivatives.

A photosensitive resin removing method in a fourth aspect of the present invention uses steam and oxygen gas together with a fluorine compound gas. In the exciting step, steam and oxygen gas are excited as well as the fluorine compound gas. Fluorine atoms and oxygen atoms dissociated from steam and oxygen gas contribute to removing the photosensitive resin and the derivatives.

A photosensitive resin removing method in a fifth aspect of the present invention uses, together with a fluorine compound gas, steam and ozone gas, or steam, oxygen gas and ozone gas. In the exciting step, ozone gas, or ozone gas and oxygen gas are excited as well as the fluorine compound gas and steam. Both fluorine atoms dissociated from the fluorine compound gas and oxygen atoms dissociated from steam, oxygen gas, or ozone gas contribute to removing the photosensitive resin and the derivatives.

A photosensitive resin removing method in a sixth aspect of the present invention uses, together with a fluorine compound gas, steam and hydrogen peroxide gas, or steam, hydrogen peroxide gas and oxygen gas. In the exciting step, hydrogen peroxide gas, or peroxide gas and oxygen gas are excited as well as the fluorine compound gas and steam. Both fluorine atoms dissociated from the fluorine compound, and oxygen atoms dissociated from steam, hydrogen peroxide or oxygen gas contribute to removing the photosensitive resin and the derivatives.

A photosensitive resin removing method in a seventh aspect of the present invention uses hydrogen peroxide gas together with a fluorine compound gas. In the exciting process hydrogen peroxide gas is excited as well as the fluorine compound gas. Both fluorine atoms dissociated from the fluorine compound gas and oxygen atoms dissociated from hydrogen peroxide gas or oxygen gas contribute to removing the photosensitive resin and the derivatives.

A photosensitive resin removing method in an eighth aspect of the present invention uses hydrogen peroxide gas and oxygen gas together with a fluorine compound gas. In the exciting step, hydrogen peroxide gas and oxygen gas are excited as well as the fluorine compound gas. Both fluorine atoms dissociated from the fluorine compound and oxygen atoms dissociated from hydrogen peroxide gas and oxygen gas contribute to removing the photosensitive resin and the derivatives.

A photosensitive resin removing apparatus in accordance with the present invention comprises a removing reaction chamber for containing a workpiece carrying a photosensitive resin, an electromagnetic-wave generator for generating microwaves, and an exciting means for exciting a mixed gas produced by mixing at least a fluorine compound gas, and steam or hydrogen peroxide gas with the microwaves. The exciting means excites steam or hydrogen peroxide gas together with the fluorine compound gas, and both fluorine atoms dissociated from the fluorine compound and oxygen atoms dissociated from steam or hydrogen peroxide contribute to removing the photosensitive resin and the derivatives.

BRIEF DESCRIPTION OF THE DRAWINGS

FIG. 6 is a schematic view of a prior art photosensitive resin removing apparatus; and FIGS. 7(A) and 7(B) are process diagrams of a prior art photosensitive resin removing method.

DETAILED DESCRIPTION OF THE PREFERRED EMBODIMENTS

First Embodiment

Figure 1:
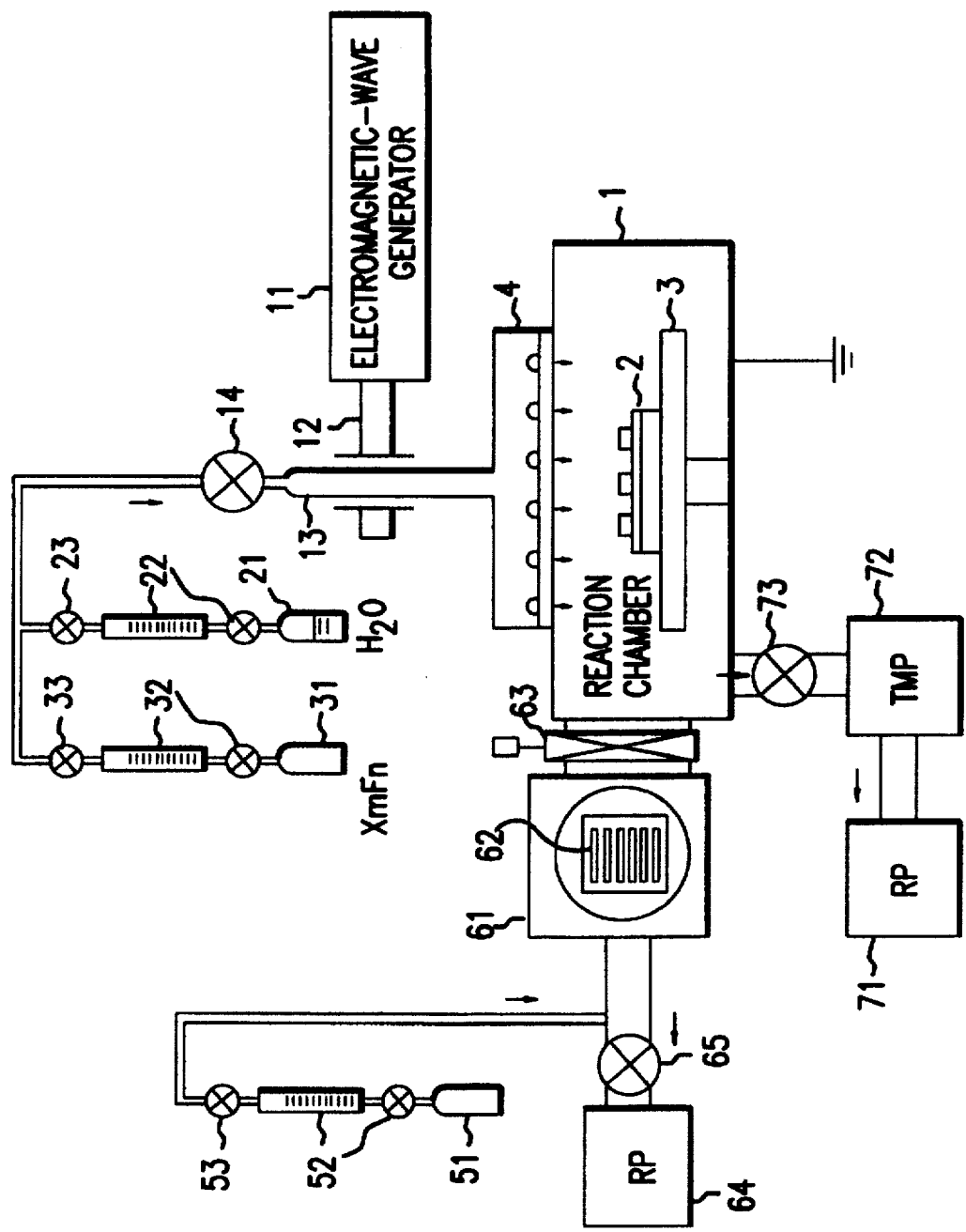
FIG. 1 is a schematic view of a photosensitive resin removing apparatus in a first embodiment according to the present invention.

Referring to FIG. 1 showing the configuration of a photosensitive resin removing apparatus suitable for carrying out a photosensitive resin removing method in a first embodiment according to the present invention, there are shown a removing reaction chamber 1 in which a photosensitive resin removing reaction occurs, a stage 3 placed in the removing reaction chamber 1 and supporting a workpiece 2 carrying a photosensitive resin to be removed, a shower head 4 for uniformly supplying a mixed gas into the removing reaction chamber 1, an electromagnetic-wave generator 11 of an output capacity in the range of 800 to 1000 W for generating microwaves of the frequency of 2.45 GHz, a waveguide 12 for transmitting the microwaves generated by the electromagnetic-wave generator 11, a quartz tube 13 extended through the waveguide 12 and connected to the removing reaction chamber 1, and a valve 14 which is opened to supply a mixed gas produced by mixing $X_mF_n$ gas and steam through the quartz tube 13 into the removing reaction chamber 1. The stage 3 is provided with a heating means, not shown, capable heating the workpiece 2 to about 150° C.

Also shown in FIG. 1 are a water tank 21 containing water ($H_2O$), a pressure/flow regulator 22 for regulating the pressure and the flow rate of steam, a valve 23 which sends out steam, a tank 31 containing a fluorine compound, a pressure/flow regulator 32 for regulating the pressure and the flow rate of the fluorine compound, and a valve 33 which sends out the fluorine compound.

Also shown in FIG. 1 are a tank 51 containing liquid nitrogen ($N_2$), a pressure/flow regulator 52 for regulating the pressure and the flow rate of nitrogen gas, a valve 53 which sends out nitrogen gas, a preparatory chamber 61 for storing a workpiece 2 to be processed, a cassette holder 62 containing a workpiece 2 and placed in the preparatory chamber 61, a gate valve 63 interposed between the removing reaction chamber 1 and the preparatory chamber 61, a rotary pump (RP) for evacuating the preparatory chamber 61 in a high vacuum, a valve 65 provided on a line connecting the rotary pump 64 to the preparatory chamber 61 and a nitrogen supply system, a rotary pump (RP) 71 for evacuating the removing reaction chamber, a turbo-molecular pump (TMP) 72 for further enhancing the vacuum of the removing reaction chamber, and a valve 73 provided on a line connecting the rotary pump 71 and the turbo-molecular pump 72 to the removing reaction chamber.

Figure 2:
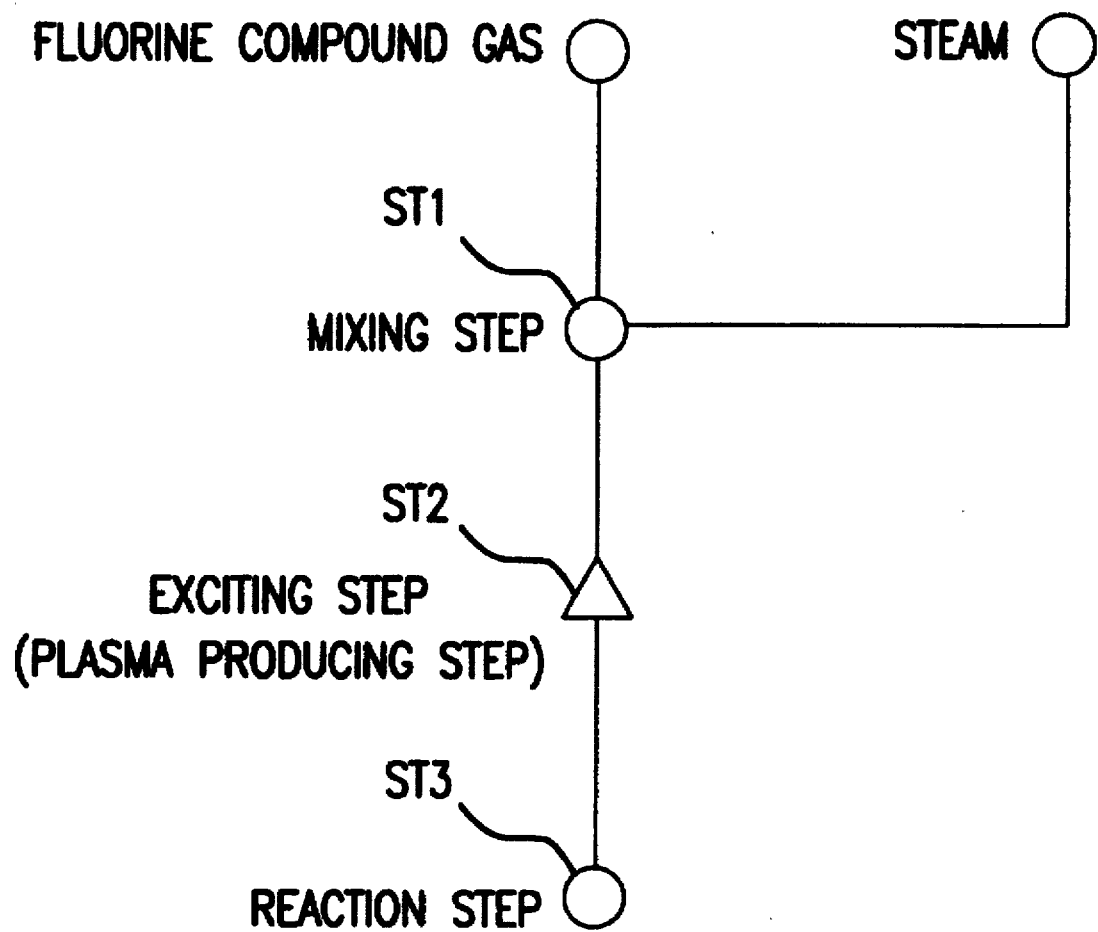
FIG. 2 is a process diagram of the photosensitive resin removing method in the first embodiment to be carried out by the photosensitive resin removing apparatus.

FIG. 2 is a process diagram showing steps of the photosensitive resin removing method in this embodiment.

The operation of the photosensitive resin removing apparatus will be described. First, processes preceding a photosensitive resin removing process will be described. For example, an 800 nm thick aluminum film is formed over a silicon dioxide film ($SiO_2$ film) formed on a silicon substrate (Si substrate). Then, a 2 μm thick positive photo-sensitive novolac resin film is formed over the aluminum film and the positive photosensitive novolac resin film is processed in a photosensitive resin pattern of 1 μm wide lines arranged at intervals of 1 μm. Then, the aluminum film is subjected to a magnetron-enhanced RIE process using a mixed gas produced by mixing boron trichloride gas ($BCl_3$), chlorine gas ($Cl_2$) and $N_2$ gas, and the photosensitive resin pattern as a mask. Then, the photosensitive resin is removed by the following procedure.

First, the workpiece 2 is put in the preparatory chamber 61. Then, an operation to evacuate the preparatory chamber 61 by opening the valve 65 and by operating the rotary pump 64, and an operation to supply $N_2$ gas into the preparatory chamber 61 are repeated alternately to evacuate the preparatory chamber 61 to a vacuum on the order of $10^{-2}$ Torr. Then, the gate valve 63 is opened and the workpiece 2 is transferred from the preparatory chamber 61 onto the stage 3 placed in the removing reaction chamber 1. The removing reaction chamber 1 is evacuated to a vacuum by the rotary pump 71, and then the removing reaction chamber 1 is evacuated still further by the turbo-molecular pump 72 to a vacuum on the order of $10^{-4}$ Torr.

In this state, the $X_mF_n$ gas is supplied from the tank 31 through the pressure/flow regulator 32 and the valve 33 and steam is supplied from the water tank 21 through the pressure/flow regulator 22 and the valve 23 in step ST1 to produce a mixed gas in a line connected to the valve 14. The water contained in the water tank 21 is heated to about 80° C. to generate steam.

In step ST2, the mixed gas, i.e., a mixture of the $X_mF_n$ gas and steam, is excited into a plasma by microwaves generated by the electromagnetic-wave generator 11 while the mixed gas flows through the quartz tube 13. When the mixed gas is excited, fluorine atoms are dissociated from the $X_mF_n$ gas and oxygen atoms are dissociated from steam. More specifically, when the mixed gas is dissociated in the exciting step, a mixed gas in a radical state are produced as well as atoms.

The excited mixed gas is supplied to the shower head 4 and the shower head 4 sprays the excited mixed gas uniformly into the removing reaction chamber 1. The oxygen atoms contained in the excited mixed gas and the component carbon atoms (C) of the photosensitive resin, i.e., an organic compound, interact to produce a gas having C—O bonds. The fluorine atoms of the excited mixed gas and the component carbon atoms (C) of the photosensitive resin interact to produce a gas having C—F bonds in step ST3. The gases thus produced are discharged through the valve 73 from the removing reaction chamber 1. Thus, the photosensitive resin coating the surface of the workpiece 2 is gasified and the gasified photosensitive resin is scattered and lost from the surface of the workpiece 2.

Since this photosensitive resin removing apparatus uses fluorine atoms in addition to oxygen atoms for removing the photosensitive resin, this photosensitive resin removing apparatus is able to remove the photosensitive resin more effectively than the prior art photosensitive resin removing apparatus. Even if derivatives of the photosensitive resin by aluminum atoms penetrated into the photosensitive resin during an etching process, the derivatives can readily be changed into gases having Al—F bonds by fluorine atoms because fluorine atoms have very high chemical activity, and the derivatives can readily be removed. In the prior art photosensitive resin removing apparatus shown in FIG. 6, the most fluorine atoms are used for dissociating steam to produce oxygen atoms and only part of fluorine atoms contributes to other actions (actions for removing the photosensitive resin and the derivatives).

As already mentioned, fluorine atoms are generally liable to react on silicon to form Si—F bonds and silicon and fluorine atoms interact to produce a gas, such as silicon tetrafluoride ($SiF_4$). Consequently, the quartz tube 13 is easy to be eroded. However, when this photosensitive resin removing apparatus operates, the mixed gas that flows through the quartz tube 13 contains oxygen atoms and OH radicals dissociated from steam. Since the oxygen atoms form Si—O bonds and the OH radicals form Si—O—H bonds, the formation of Si—F bonds is suppressed and, consequently, the erosion of the quartz tube 13 can be prevented.

The photosensitive resin removing method will more concretely be described hereinafter. In the mixing step, the pressure/flow regulator 33 was adjusted to supply $NF_3$ gas at 30 sccm (standard cubic centimeter per minute) and the pressure/flow regulator 23 was adjusted to supply steam at 200 sccm to produce a mixed gas of 0.2 Torr. In the exciting step, the mixed gas was passed through the quartz tube 13 in which 2.45 GHz microwaves of 1000 W in power are present. In the reaction step, the workpiece 2 heated at 150° C. was exposed to the excited mixed gas for 60 sec. The photosensitive resin was removed completely at an ashing rate of 2 μm/min. The quartz tube 13 was 30 mm in outside diameter, 1 mm in wall thickness and 20 mm in length.

Second Embodiment

In the mixing step, a mixed gas was produced by supplying $CF_4$ gas at 65 sccm and steam at 200 sccm. In the reaction step, both oxygen atoms and fluorine atoms contributed to removing the photosensitive resin and the photosensitive resin was removed completely. Further, based on formations of Si—O bonds by oxygen atoms, and Si—O—H bonds by OH radicals, the formation of Si—F bonds was suppressed and the erosion of the quartz tube could be prevented.

Third Embodiment

Figure 3:
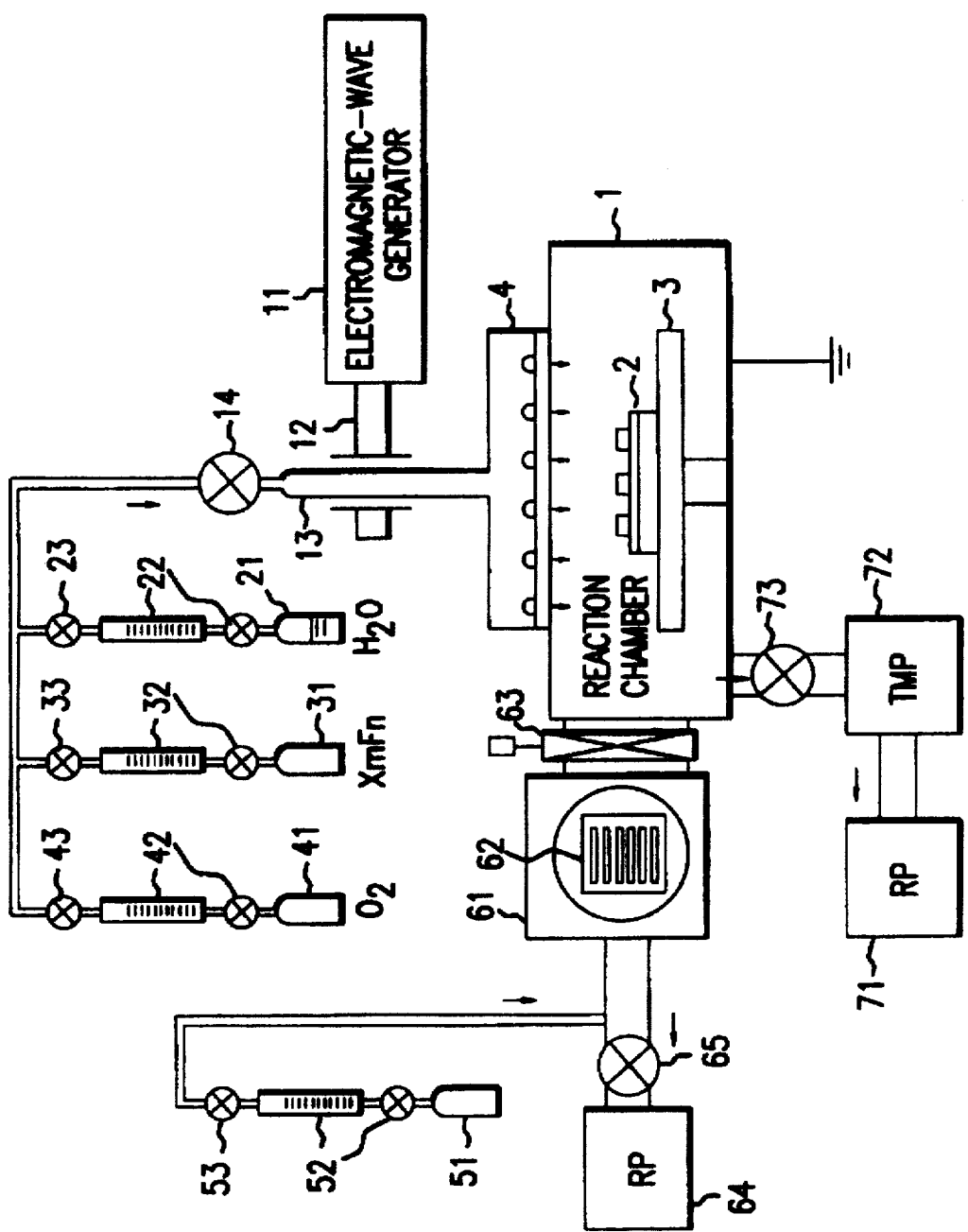
FIG. 3 is a schematic view of a photosensitive resin removing apparatus in a third embodiment according to the present invention.

Oxygen gas may be used in addition to steam in the mixing step as shown in FIG. 3. Shown in FIG. 3 are a tank 41 containing $O_2$ gas, a pressure/flow regulator 42 for regulating the pressure and the flow rate of $O_2$ gas and a valve 43 provided on an oxygen gas supply line.

A mixed gas of 1 Torr was produced by supplying $CF_4$ gas ($X_mF_n$ gas) at 65 sccm, steam at 200 sccm and $O_2$ gas at 1540 sccm. In the exciting process, the mixed gas was passed through a space in which 2.45 GHz microwaves of 1000 W in power was present. In the reaction step, the workpiece 2 heated at 150° C. was exposed to the mixed gas for 90 sec. Consequently, the photosensitive resin was removed completely at an ashing rate of 1 μm/min. The quartz tube 13 was not eroded either. Since the mixed gas contains a large amount of oxygen molecules, the enhancement of the effect of the mixed gas in preventing the erosion of the quartz tube 13 is expected.

Fourth Embodiment

Figure 4:
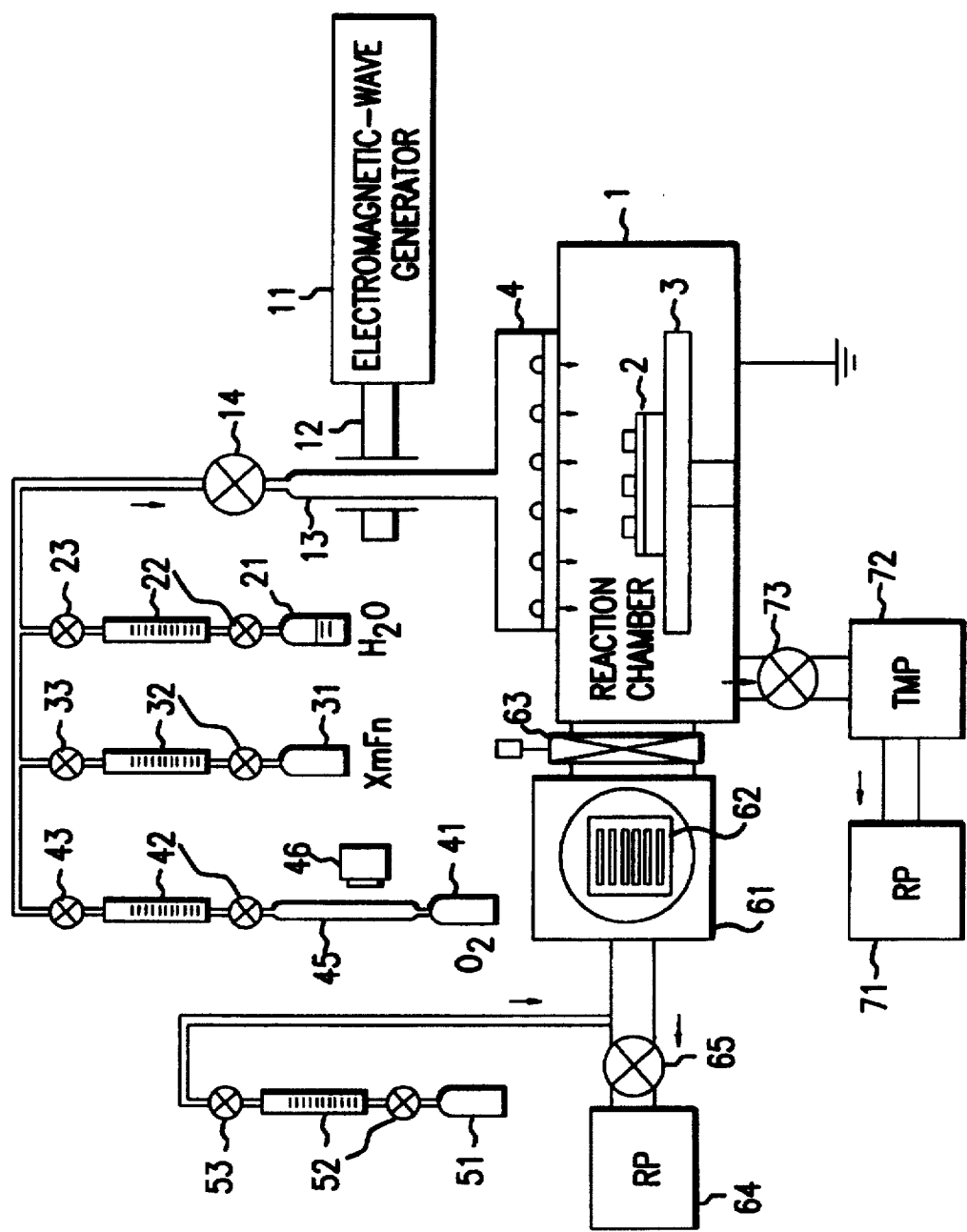
FIG. 4 is a schematic view of a photosensitive resin removing apparatus in a fourth embodiment according to the present invention.

The mixing gas produced in the mixing step may contain both $O_2$ gas and ozone gas ($O_3$ gas) in combination or $O_3$ gas instead of $O_2$ gas. For example, a quartz tube 45 is provided on a line through which $O_2$ gas is supplied, and a Tesla coil 46 is disposed near the quartz tube 45 as shown in FIG. 4, and $O_2$ gas is subjected to silent discharge produced by the Tesla coil 46 to produce $O_3$ gas or a mixed gas consisting of $O_3$ gas and $O_2$ gas. Such a mixed gas or $O_3$ gas may be produced by irradiating $O_2$ gas flowing through the quartz tube 45 with ultraviolet radiation.

This photosensitive resin removing method, as well as the aforesaid methods, could remove the photosensitive resin completely and prevented the erosion of the quartz tube 13. When a mixed gas containing $O_3$ gas is used, the $O_3$ gas is decomposed into oxygen atoms and stable $O_2$ gas, the oxygen atoms contribute to removing the photosensitive resin and the $O_2$ gas contributes to preventing the erosion of the quartz tube 13. The $O_2$ gas contributes to preventing the corrosion of the aluminum wiring lines.

Fifth Embodiment

The mixing gas may contain hydrogen peroxide gas ($H_2O_2$ gas) instead of steam or both steam and $H_2O_2$ gas; that is, the mixed gas to be excited may contain $X_mF_n$ gas and $H_2O_2$ gas, or $X_mF_n$ gas, $H_2O_2$ gas and $O_2$ gas or may contain steam in addition to those gases. When such a mixed gas was used, the photosensitive resin could completely be removed and the erosion of the quartz tube 13 was prevented.

In this case, the $H_2O_2$ gas is decomposed first into steam and oxygen atoms, and the steam is further decomposed into oxygen atoms and hydrogen atoms to increase the quantity of hydrogen atoms. Consequently, the reliability in removing the photosensitive resin and preventing the erosion of the quartz tube 13 can be enhanced. A 30% aqueous hydrogen peroxide solution was heated at 80° C. to produce $H_2O_2$ gas.

Figure 5A:
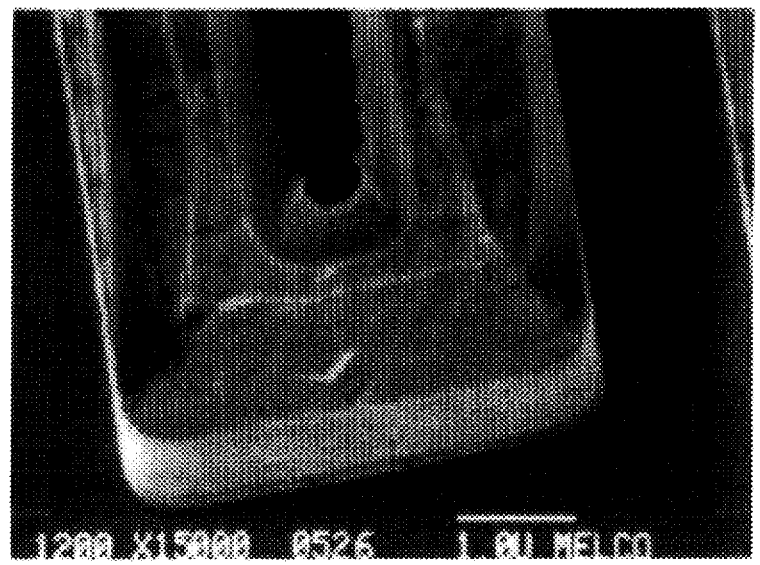
FIGS. 5(A) and 5(B) are a photograph of the surface of an aluminum pattern in a state after a photosensitive resin mask has been removed by a prior art photosensitive resin removing method and a photograph of the surface of an aluminum pattern in a state after a photosensitive resin mask has been removed by a photosensitive resin removing method in accordance with the present invention respectively.
Figure 5B:
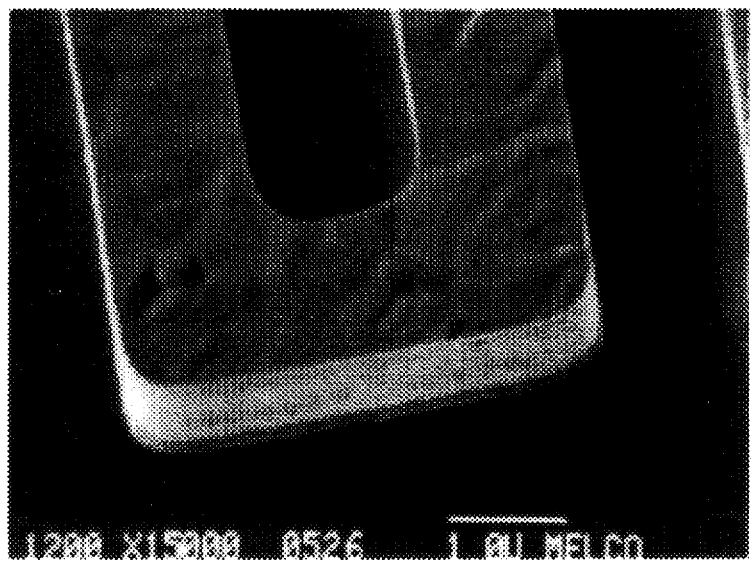

The following effects of the foregoing embodiments were confirmed. When etching an aluminum film by RIE using a mixed gas consisting of $BCl_3$, $Cl_2$ gas and $N_2$ gas, $BCl_3$, $Cl_2$ and chlorine atoms penetrate into the surface of the aluminum film and into the derivatives of the photosensitive resin. When the prior art photosensitive resin removing method is used, moisture contained in the atmosphere and the chlorine atoms interact to produce chloric acid (HCl), and the chloric acid corrodes the aluminum film and damages the aluminum wiring pattern. When the photosensitive resin was removed by the photosensitive resin removing methods of the present invention, the aluminum film was not corroded. FIG. 5(A) is a photograph of the surface of an aluminum pattern a predetermined time after removing the photosensitive resin film by the prior art photosensitive resin removing method and 5(B) is a photograph of the surface of an aluminum pattern a predetermined time after removing the photosensitive resin by the photosensitive resin removing method of the present invention.

Although the embodiments have been described as applied to processing a workpiece 2 carrying an aluminum film to be etched by dry etching, the present invention is applicable to processing a workpiece carrying an aluminum-copper (Al—Cu, 1% Cu) film. The effect of the foregoing embodiments when applied to processing a workpiece carrying an Al—Cu film was the same as that of the same when applied to processing the workpiece carrying the Al film.

As described above, when steam is excited together with a fluorine compound gas, fluorine atoms are dissociated from the fluorine compound and oxygen atoms are dissociated from the steam, both the fluorine atoms and the oxygen atoms contribute to removing the photosensitive resin and its derivatives, and the photosensitive resin and its derivatives can completely be removed without leaving any residual photosensitive resin and any residual derivatives. The oxygen atoms and the O—H radicals contained in the gas flowing through the quartz tube in the exciting step prevents the deterioration of the quartz tube.

When steam is excited together with nitrogen trifluoride gas, the mixed gas to be used in the reaction step contains only small kinds of atoms, i.e., N atoms, F atoms, H atoms and O atoms, and does not contain any atoms that cause complex reactions. Therefore it is easy to determine optimum process conditions for removing the photosensitive resin.

When steam is excited together with carbon tetrafluoride, both carbon atoms dissociated from the carbon tetrafluoride gas and carbon atoms dissociated from the photosensitive resin are present in the chamber for removing. Therefore, the reaction step can be easily maintained under the balanced condition of both the carbon atoms and removal at a uniform ashing rate can be expected.

When steam and oxygen gas are excited together with a fluorine compound gas, the increased quantity of oxygen molecules further suppresses the deterioration of the quartz tube.

When ozone gas, or ozone gas and oxygen gas are excited together with a fluorine compound gas and steam, the ozone gas is decomposed into oxygen atoms and oxygen molecules, the oxygen atoms and fluorine atoms serves to remove the photosensitive resin and its derivatives completely, and the oxygen molecules suppresses the deterioration of the quartz tube.

When hydrogen peroxide gas, or hydrogen peroxide gas and oxygen gas are excited together with a fluorine compound gas and steam, oxygen atoms dissociated from the steam and the hydrogen peroxide remove the photosensitive resin and its derivatives completely, and stable $H_2O$ enhances the effect in suppressing the deterioration of the quartz tube.

When hydrogen peroxide gas, or hydrogen peroxide gas and oxygen gas are excited together with a fluorine compound gas, oxygen atoms dissociated from the hydrogen peroxide remove the photosensitive resin and its derivatives completely, and stable $H_2O$ enhances the effect in suppressing the deterioration of the quartz tube.

When steam or hydrogen peroxide is excited together with a fluorine compound gas, both fluorine atoms dissociated from the fluorine compound and oxygen atoms dissociated from the steam or the hydrogen peroxide contribute to completely removing the photosensitive resin and its derivatives, and the oxygen atoms and O—H radicals present in the exciting step prevent the deterioration of the quartz tube.

What is claimed is:

1. A photosensitive resin removing method to be applied to removing a photosensitive resin used in a dry etching process for forming a metal pattern after the completion of the dry etching process, said photosensitive resin removing method comprising:

a mixing step for producing a mixed gas by mixing a fluorine compound gas, steam and ozone gas;

an exciting step for exciting the mixed gas; and a reaction step for exposing the photosensitive resin to the excited mixed gas to gasify the photosensitive resin.

2. A photosensitive resin removing method according to claim 1, wherein the fluorine compound gas is nitrogen trifluoride gas.

3. A photosensitive resin removing method according to claim 1, wherein the fluorine compound gas is carbon tetrafluoride gas.

4. A photosensitive resin removing method according to claim 1, wherein the mixed gas further contains oxygen gas.

5. A photosensitive resin removing method to be applied to removing a photosensitive resin used in a dry etching process for forming a metal pattern after the completion of the dry etching process, said method comprising:

a mixing step for producing a mixed gas by mixing a fluorine compound gas and hydrogen peroxide gas;

an exciting step for exciting the mixed gas; and a reaction step for exposing the photosensitive resin to the excited mixed gas.

6. A photosensitive resin removing method according to claim 5, wherein the mixed gas further contains oxygen gas in addition to hydrogen peroxide gas.

7. A photosensitive resin removing method according to claim 5, wherein the mixed gas further contains steam.

8. A photosensitive resin removing method according to claim 7, wherein the mixed gas futher contains oxygen gas.

9. A photosensitive resin removing method according to claim 5, wherein the fluorine compound gas is nitrogen trifluoride gas.

10. A photosensitive resin removing method according to claim 5, wherein the fluorine compound gas is carbon tetrafluoride gas.

* * * * *